United States Patent [19]
Kaku

[11] Patent Number: 5,896,064
[45] Date of Patent: Apr. 20, 1999

[54] GAIN CONTROLLER FOR VARIABLE-GAIN AMPLIFIER

[75] Inventor: Tomoya Kaku, Tokyo, Japan

[73] Assignee: NEC Corporation, Japan

[21] Appl. No.: 08/872,687

[22] Filed: Jun. 11, 1997

[30] Foreign Application Priority Data

Jun. 11, 1996 [JP] Japan ................... 8-149548

[51] Int. Cl.$^6$ ................................. H03G 3/30
[52] U.S. Cl. ................ 330/279; 330/129; 455/126; 455/234.2
[58] Field of Search ................. 330/129, 138, 330/279, 280; 375/345; 455/126, 234.2

[56] References Cited

U.S. PATENT DOCUMENTS 4,546,326 10/1985 Van Uffelen et al. ............... 330/129

FOREIGN PATENT DOCUMENTS 63-167557 7/1988 Japan.

Primary Examiner—James B. Mullins

[57] ABSTRACT

An automatic gain controller controls the gain of a variable-gain amplifier based on an error signal which is corrected by a correction controller using discrete characteristic data which are sampled from a gain control characteristic of the variable-gain amplifier in sampling steps each being set depending on a variation of the gain control characteristic. The correction controller corrects the error signal based on continuous characteristic data generated from the discrete characteristic data stored in the memory so that the gain control characteristic of the variable-gain amplifier is substantially linear with respect to the error signal.

17 Claims, 9 Drawing Sheets

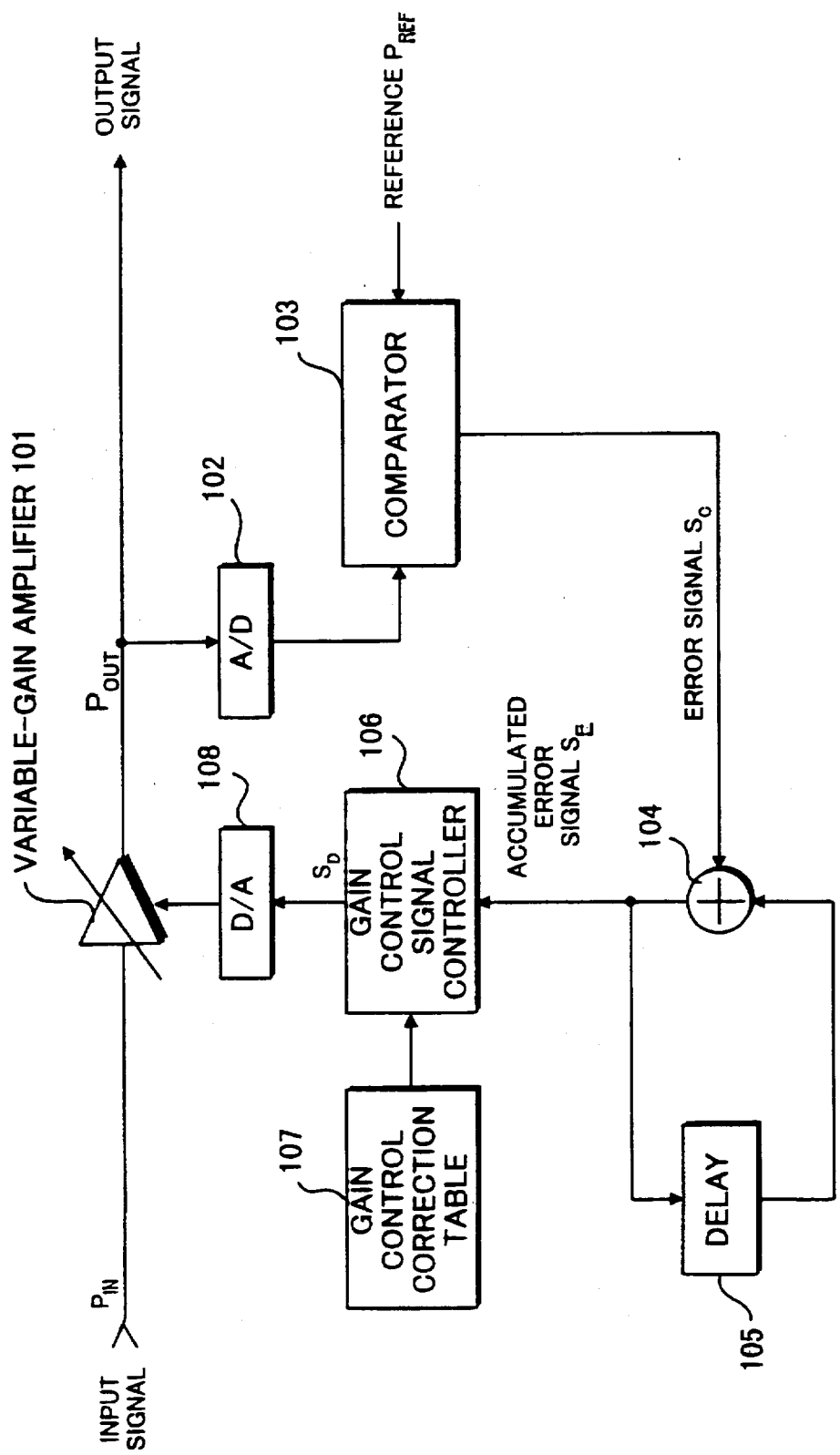

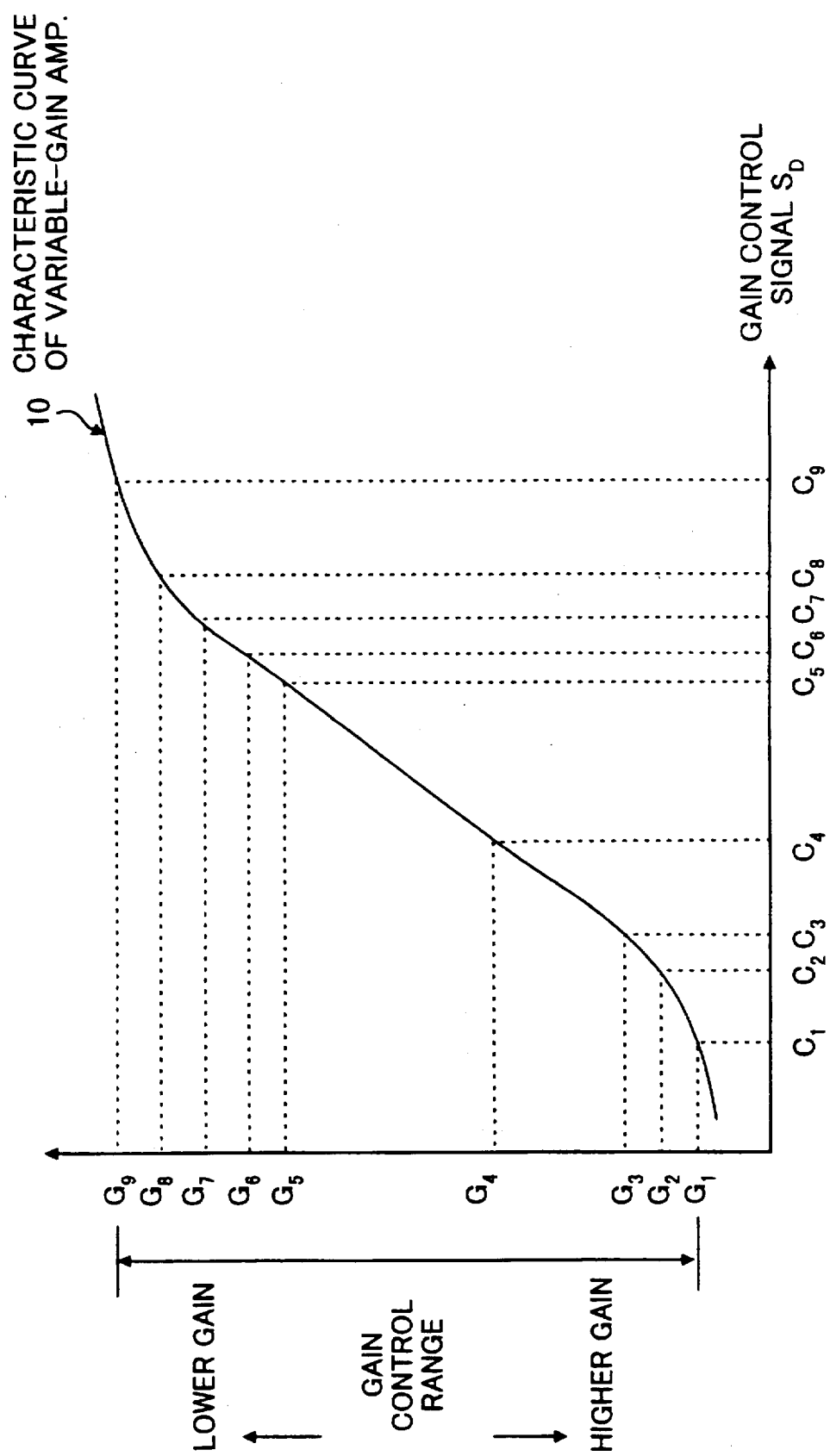

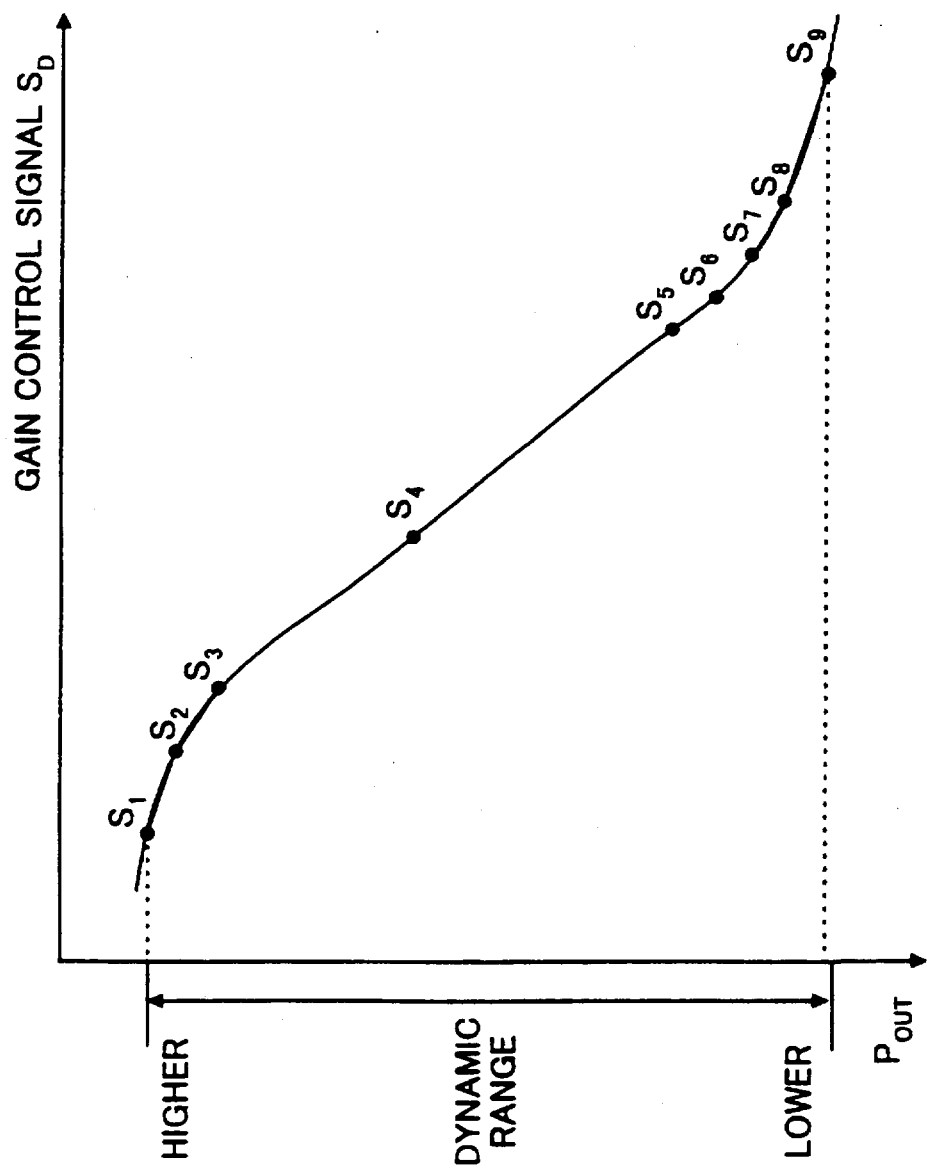

GAIN CONTROLLER FOR VARIABLE-GAIN AMPLIFIER

BACKGROUND OF THE INVENTION

1. Field of the Invention

The present invention generally relates to gain control of a variable-gain amplifier and, in particular, to a gain control method and apparatus suitable for a system necessitating fine gain control such as a DS-CDMA (Direct Sequence-Code Division Multiple Access) system.

2. Description of the Related Art

In a DS-CDMA system, a plurality of channels are assigned to a single frequency band, and each user's PN (pseudorandom noise) sequence is generated by a unique code to allow receivers to distinguish among different user's signals. That is, the receiver performs reverse-spreading or despreading of the received signal by multiplying it by a replica of the PN sequence used at the transmitter. Since the receiver uses a PN code unique to the desired user signal, the signals coded with other users' codes simply appear as noise, resulting in deteriorated quality of communications.

Therefore, it is important that the power of each user's transmitter is controlled by the central base station so that the same power is received from every terminal and the power level is constant with time. In other words, the transmission power of each terminal must be precisely controlled in any DS-CDMA system serving mobile users. According to Interim Standard 95 (IS 95) released by TIA (Telecommunications Industry Association) in North America for Code Division Multiple Access (CDMA), transmission power tolerance is specified at ±0.5 dB. Further, the receiver performs reverse-spreading of the received signal to distinguish among different users' signals. Therefore, fine gain control is also necessary for the receiver of each terminal to perform linear signal processing.

The transmission power control and the gain control as described above are performed by an automatic gain control (AGC) circuit using a variable-gain amplifier. More specifically, the output level of the variable-gain amplifier is compared with a target level, and the gain of the variable-gain amplifier is controlled so as to reduce the difference between the output level and the target level according to the comparison result.

To achieve the precise AGC characteristic, the gain of the variable-gain amplifier should be linearly changed according to a gain control signal $S_D$ over a wide dynamic range. However, in general, a variable-gain amplifier does not have the linear gain control characteristic over its whole dynamic range but a non-linear gain control characteristic as shown by a characteristic curve 10 in FIG. 1A. Therefore, it is necessary to correct the gain control signal $S_D$ applied to the variable-gain amplifier so as to provide the linear gain control characteristic.

According to a conventional AGC circuit, a correction table is previously stored onto a memory such as ROM, and the gain control signal $S_D$ to be applied to the variable-gain amplifier is corrected using the correction table. More specifically, as shown in FIG. 1A, a plurality of discrete points (in this figure, gain values $G_1$–$G_9$ and gain control values $C_1$–$C_9$) are previously sampled from the characteristic curve 10 of the variable-gain amplifier over the gain control range, and a set of discrete data showing the relationship between the discrete gain values $G_1$–$G_9$ and gain control values $C_1$–$C_9$ of the gain control signal $S_D$ is stored in the memory. Such discrete data reduce the amount of data stored in the memory. By the linear interpolation using the discrete data of the correction table, the gain control signal $S_D$ is corrected to provide the linear gain control characteristic to the variable-gain amplifier.

Such a control method using a correction table as mentioned above has been disclosed in Japanese Patent Laid-open No. 63-167557. Although the control circuit is included in a semiconductor laser driver, the output power of the laser is automatically controlled by a feedback loop using the correction table.

However, the conventional control method and AGC circuit cannot provide precise correction of the gain control signal $S_D$ to be applied to the variable-gain amplifier. As described above, the gain control range of the variable-gain amplifier is equally divided to obtain the discrete gain values $G_1$–$G_9$ as shown in FIG. 1A. And the gain control values between the discrete values of the gain control signal $S_D$ can be obtained by linear interpolation from the correction table. Therefore, in cases where the characteristic curve 10 has a sharp curvature, the corrected gain control signal derives from an ideal gain control signal at the location of that sharp curvature.

More specifically, when the characteristic curve 10 has a sharp curvature (for example, between the gain control values $C_1$ and $C_2$, $C_7$ and $C_8$, or $C_8$ and $C_9$ in FIG. 1A), as shown in FIG. 1B, a corrected output characteristic curve 11 of the variable-gain amplifier deviates from an actual output characteristic curve 12 between sample positions $S_1$ and $S_2$, $S_7$ and $S_8$, or $S_8$ and $S_9$. Such a deviation causes the power control in the DS-CDMA system to be deteriorated, resulting in reduced quality of communication.

SUMMARY OF THE INVENTION

An object of the present invention is to provide a gain control method and apparatus which can achieve precise gain control of a variable-gain amplifier.

Another object of the present invention is to provide a gain control method and apparatus which can provide precise power control to achieve high quality of communication in a DS-CDMA system.

According to the present invention, in a gain control apparatus for controlling a gain of a variable-gain amplifier based on an error signal corresponding to a difference between an output level of the variable-gain amplifier and a reference level, discrete characteristic data are sampled from a gain control characteristic of the variable-gain amplifier in sampling steps each being set depending on a variation of the gain control characteristic. The discrete characteristic data are stored in a memory. A correction controller corrects the error signal based on continuous characteristic data generated from the discrete characteristic data stored in the memory so that the gain control characteristic of the variable-gain amplifier is substantially linear with respect to the error signal.

Since each sampling step is set depending on a variation of the gain control characteristic, the continuous characteristic data generated from the discrete characteristic data is closely analogous to the gain control characteristic of the variable-gain amplifier. Therefore, the error signal can be precisely corrected so that the gain control characteristic of the variable-gain amplifier is substantially linear with respect to the error signal, resulting in precise gain control of a variable-gain amplifier and improved quality of communication in the DS-CDMA system.

BRIEF DESCRIPTION OF THE DRAWINGS

FIG. 2 is a block diagram showing an automatic gain control circuit according to an embodiment of the present invention;

FIG. 4A is a diagram showing a gain control characteristic curve of a variable-gain amplifier for explanation of a correction method for a gain control signal according to the embodiment;

FIG. 4C is a diagram showing an output characteristic curve of the variable-gain amplifier controlled according to the embodiment;

DETAILED DESCRIPTION OF THE PREFERRED EMBODIMENTS

Figure 1A:
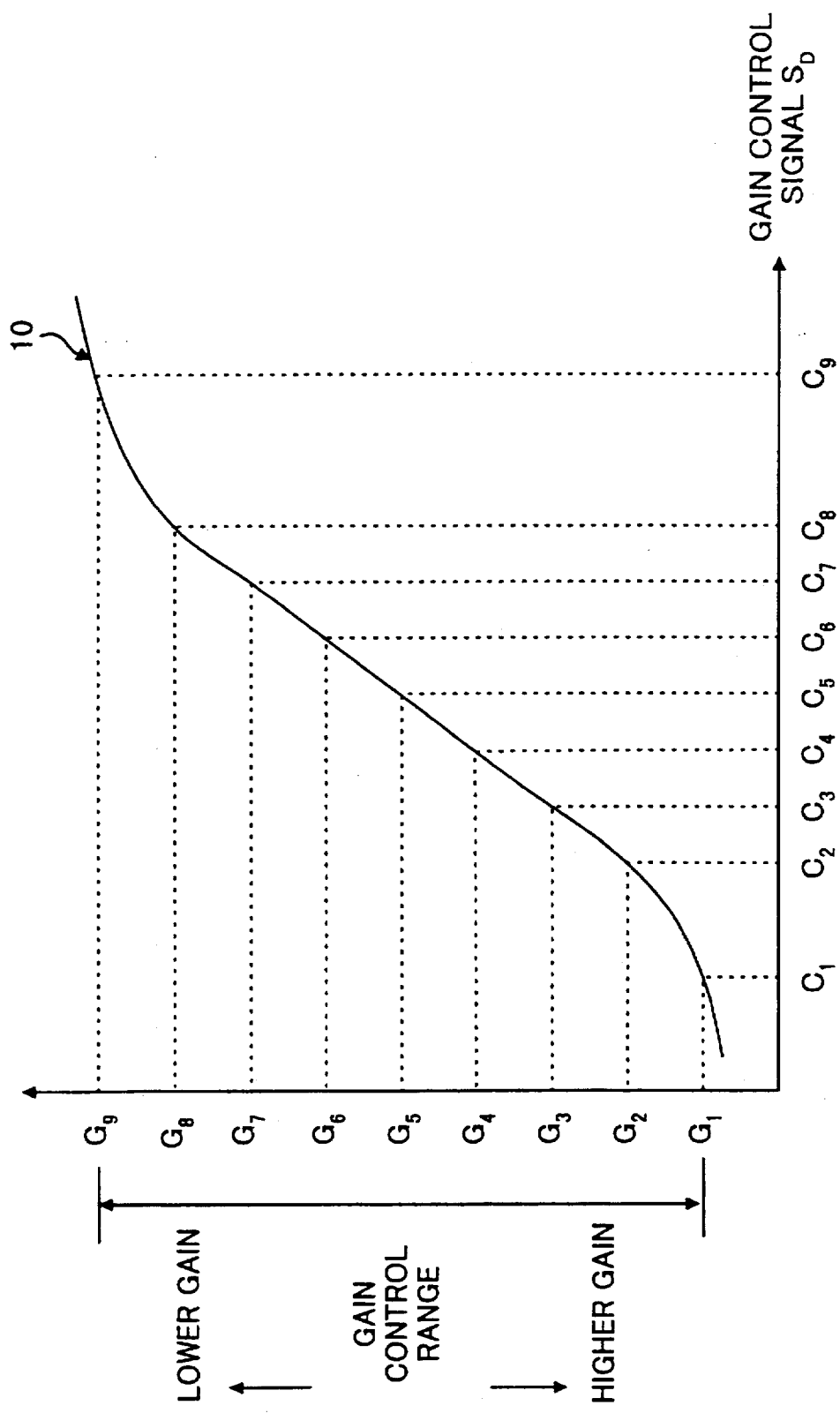
FIG. 1A is a diagram showing a gain control characteristic curve of a variable-gain amplifier for explanation of a conventional correction method for a gain control signal.

Referring to FIG. 2, there is shown an AGC circuit in accordance with an embodiment of the present invention. The AGC circuit controls the gain of a variable-gain amplifier 101 so that the output level of an analog output signal $P_{OUT}$ is kept at a reference output level or target level $P_{REF}$.

The analog output signal $P_{OUT}$ of the variable-gain amplifier 101 is converted to a digital signal by an analog-to-digital converter 102, and the digital output signal is supplied to a comparator 103. The comparator 103 compares the power level of the output signal with the reference output level $P_{REF}$ to produce an error signal $S_C$ representing the difference between the output level of the output signal $P_{OUT}$ and the reference output level $P_{REF}$. For example, when the output level is greater than the reference level $P_{REF}$, the error signal $S_C$ rises to a positive value corresponding to the difference therebetween. Contrarily, when the output level is smaller than the reference level $P_{REF}$, the error signal $S_C$ falls to a negative value corresponding to the difference therebetween. The error signal $S_C$ is accumulated by an accumulator or a filter to produce an accumulated error signal $S_E$. The accumulator is comprised of an adder 104 and a delay section 105 which are connected such that the output of the adder 104 is delayed by the delay section 105 whose output is added to the error signal $S_C$ by the adder 104. The accumulated error signal $S_E$ becomes larger when the error signal $S_C$ is positive and becomes smaller when the error signal $S_C$ is negative.

The accumulated error signal $S_E$ is corrected by a gain control signal controller 106 using a gain control correction table 107 stored in a memory. As will be described in detail, the gain control correction table 107 previously stores the gain control characteristic of the variable-gain amplifier 101. By using the gain control correction table 107, the gain control signal controller 106 corrects the accumulated error signal $S_E$ to produce a digital gain control signal so as to achieve the linear AGC characteristic of the variable-gain amplifier 101. The digital gain control signal generated by the gain control signal controller 106 is converted to an analog gain control signal $S_D$ by a digital-to-analog converter 108. The analog gain control signal $S_D$ is applied to the control terminal of the variable-gain amplifier 101.

Figure 3:
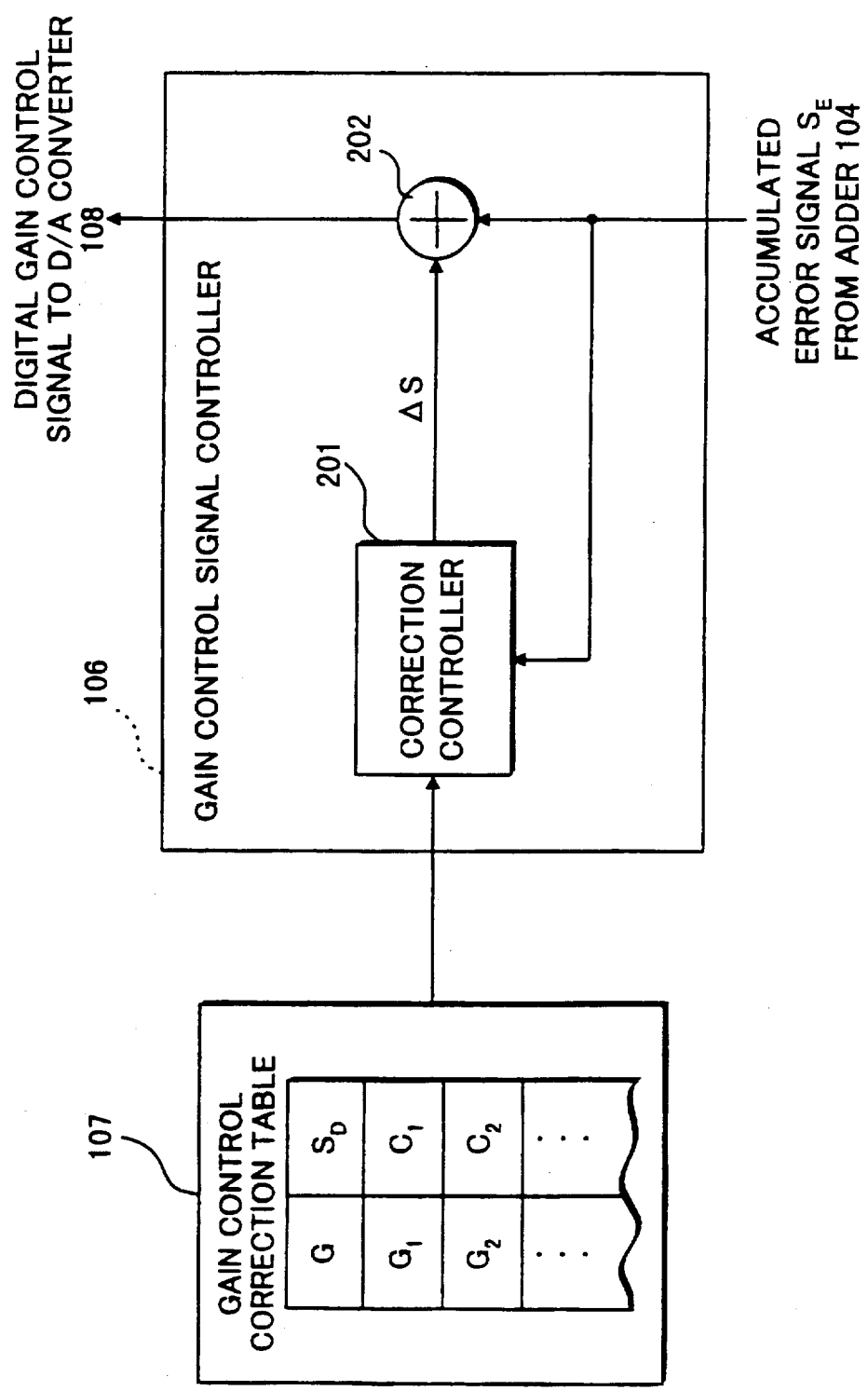
FIG. 3 is a block diagram showing an example of a gain control signal controller in the embodiment as shown in FIG. 2.

Referring to FIG. 3, the gain control signal controller 106 is comprised of a correction controller 201 and an adder 202. The correction controller 201 receives the accumulated error signal $S_E$ from the adder 104 of the accumulator and produces a correction signal $\Delta S$ by linear interpolation using the gain control correction table 107. The correction signal $\Delta S$ is added to the accumulated error signal $S_E$ by the adder 202 to produce the digital gain control signal. The contents of the gain control correction table 107 and the operation of the correction controller 201 will be described in detail referring to FIGS. 4A to 4C.

Referring to FIG. 4A, the gain control correction table 107 previously stores a plurality of discrete points (in this figure, gain values $G_1$–$G_9$ and gain control values $C_1$–$C_9$) which are sampled from the characteristic curve 10 of the variable-gain amplifier 101 over the gain control range. More specifically, discrete points are sampled at smaller steps as the curvature of the characteristic curve 10 becomes sharper. In other words, a sampling step is determined so that the linear interpolation is sufficiently effective. As shown in FIG. 4A, since the characteristic curve 10 is relatively sharp in a higher gain range between gain control values $C_1$ and $C_3$, the corresponding discrete points are sampled at smaller steps. In a middle gain range between gain control values $C_3$ and $C_5$ where the characteristic curve 10 is almost linear, the corresponding discrete points are sampled at larger steps. And, since the characteristic curve 10 is relatively sharp in a lower gain range between gain control values $C_5$ and $C_9$, the corresponding discrete points are sampled at smaller steps. In this manner, a set of discrete data showing the relationship between the discrete gain values and the gain control values is stored in the gain control correction table 107 as shown in FIG. 3.

The correction controller 201 performs the linear interpolation from the gain control correction table 107 to produce continuing characteristic data which is used to produce the correction signal $\Delta S$ so as to provide the linear gain control characteristic with respect to the accumulated error signal $S_E$.

Figure 4B:
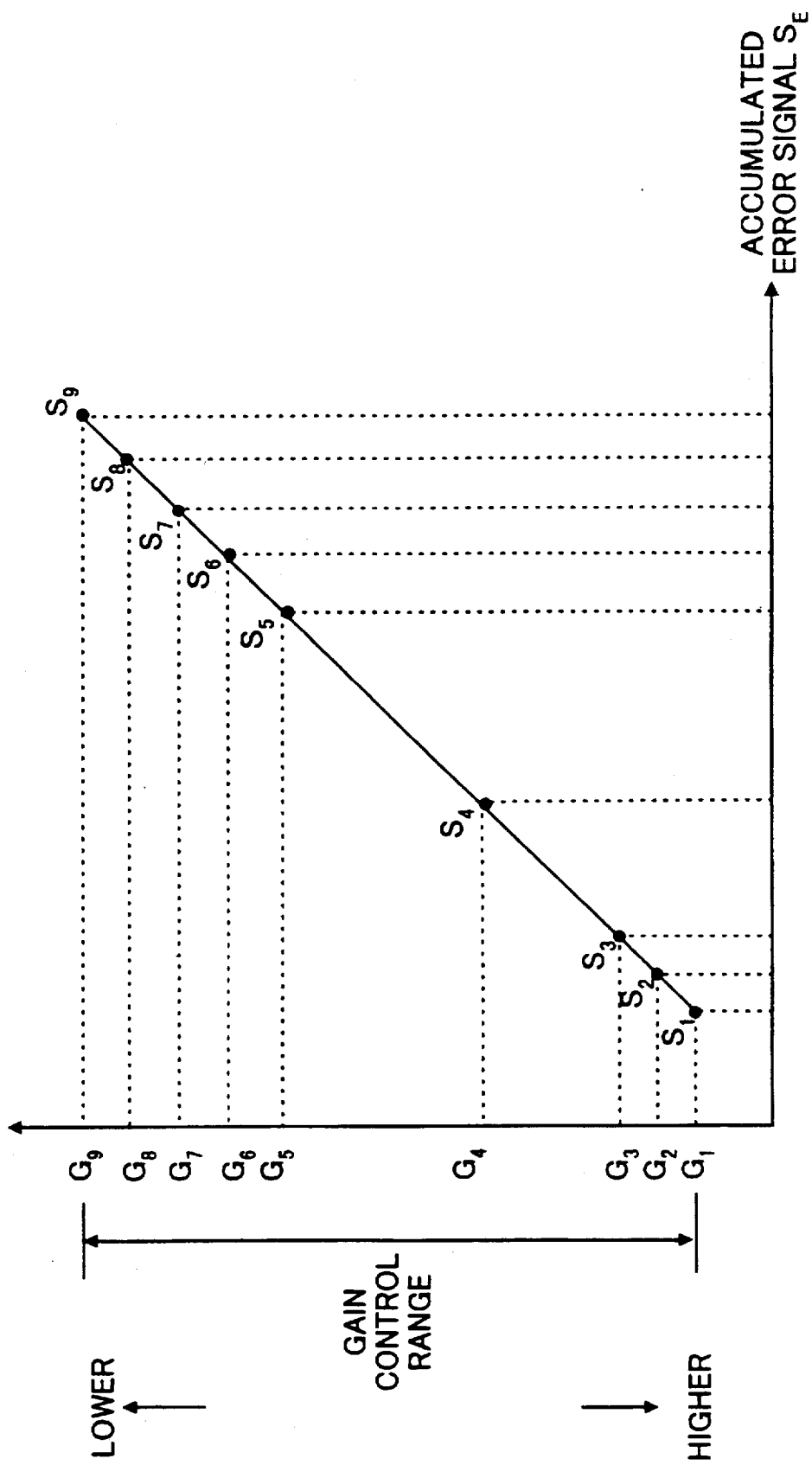
FIG. 4B is a diagram showing a gain control characteristic curve of a variable-gain amplifier with respect to an accumulated error signal for explanation of the correction method for a gain control signal according to the embodiment.

More specifically, referring to FIG. 4B, the correction controller 201 generates the correction signal $\Delta S$ using the gain control correction table 107 so that the gain control characteristic of the variable-gain amplifier 101 is substantially linear with respect to the accumulated error signal $S_E$. According to the present invention, as described above, the discrete characteristic data is sampled in sampling steps each of which is determined depending on the degree of a curvature of the gain control characteristic curve 10. Therefore, the linear interpolation is more effective, resulting in improved linear gain control characteristic of the AGC circuit.

Referring to FIG. 4C, as a result, even when the characteristic curve 10 has a sharp curvature (for example, between the gain control values $C_1$ and $C_2$, $C_7$ and $C_8$, or $C_8$ and $C_9$ in FIG. 4A), as shown in FIG. 4C, a corrected output characteristic curve of the variable-gain amplifier is substantially coincident with an actual output characteristic curve over the whole range, especially between sample positions $S_1$ and $S_2$, $S_7$ and $S_8$, or $S_8$ and $S_9$. Such an advantage causes the power control in the DS-CDMA system to be improved, resulting in improved quality of communication.

Figure 5:
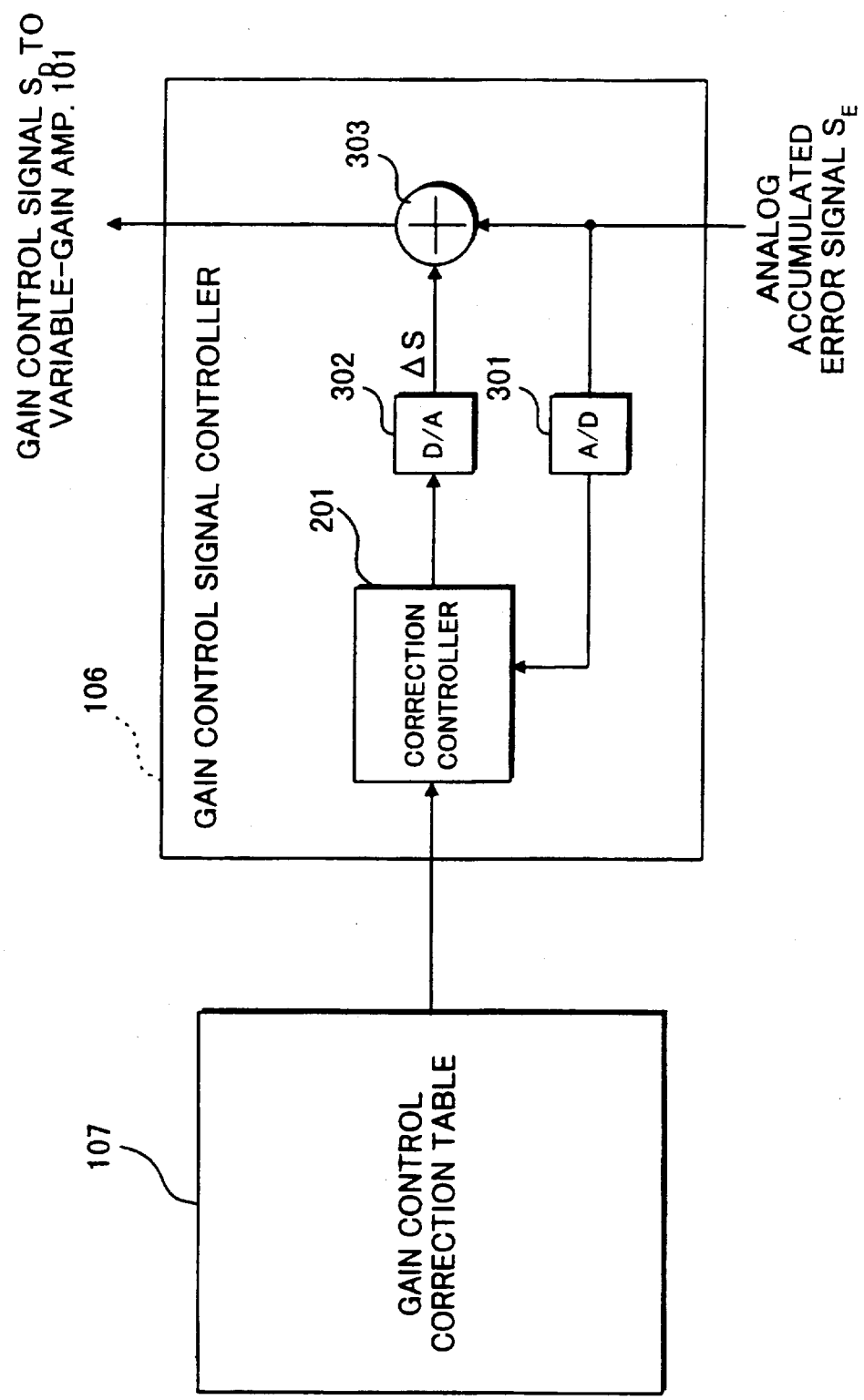
FIG. 5 is a block diagram showing another example of a gain control signal controller in another embodiment of the present invention.

Referring to FIG. 5, the AGC circuit may be formed with analog signal processing. In this case, the gain control signal controller 106 receives an analog accumulated error signal $S_E$ from the accumulator. The gain control signal controller 106 is comprised of the correction controller 201, an analog-to-digital converter 301, a digital-to-analog converter 302 and an analog adder 303. The analog accumulated error signal $S_E$ is converted to a digital form and is output to the correction controller 201. The correction data generated by the correction controller 201 is converted to an analog form and the analog correction signal $\Delta S$ is added to the analog accumulated error signal $S_E$ to produce the gain control signal $S_D$.

In radio communications of the DS-CDMA system, there are cases where the transmission power level is determined depending on the received signal level. More specifically, when the received signal level is relatively high, there is a strong likelihood of the mobile terminal being located near a radio base station. Therefore, in this case, the transmission power is set to a reduced level. Contrarily, when the received signal level is relatively low, the transmission power is set to an increased level. Such a transceiver of the mobile terminal transceiver in the DS-CDMA mobile communications system will be described hereinafter.

Figure 1B:
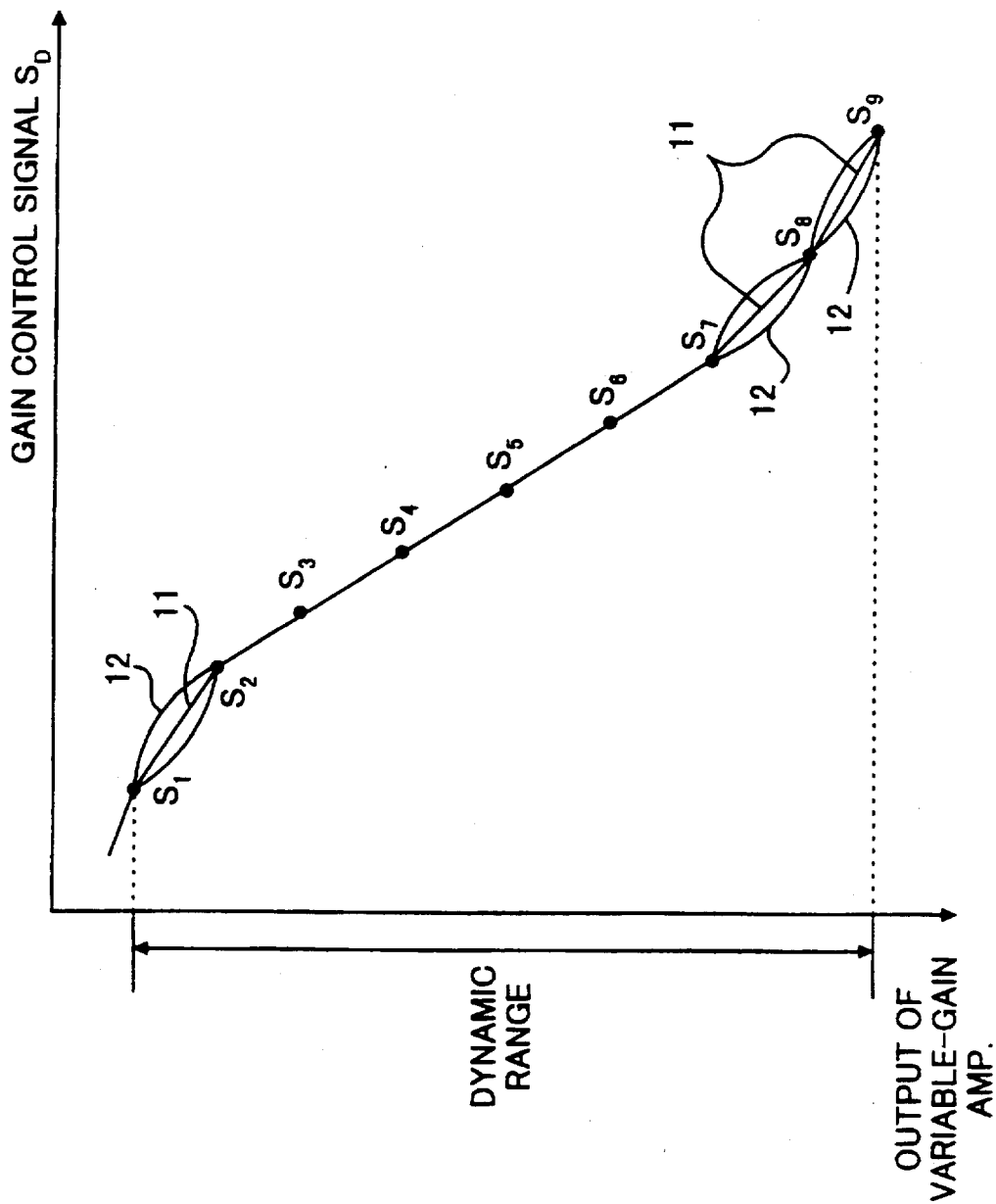
FIG. 1B is a diagram showing an output characteristic curve of the variable-gain amplifier controlled according to the conventional correction method.
Figure 6:
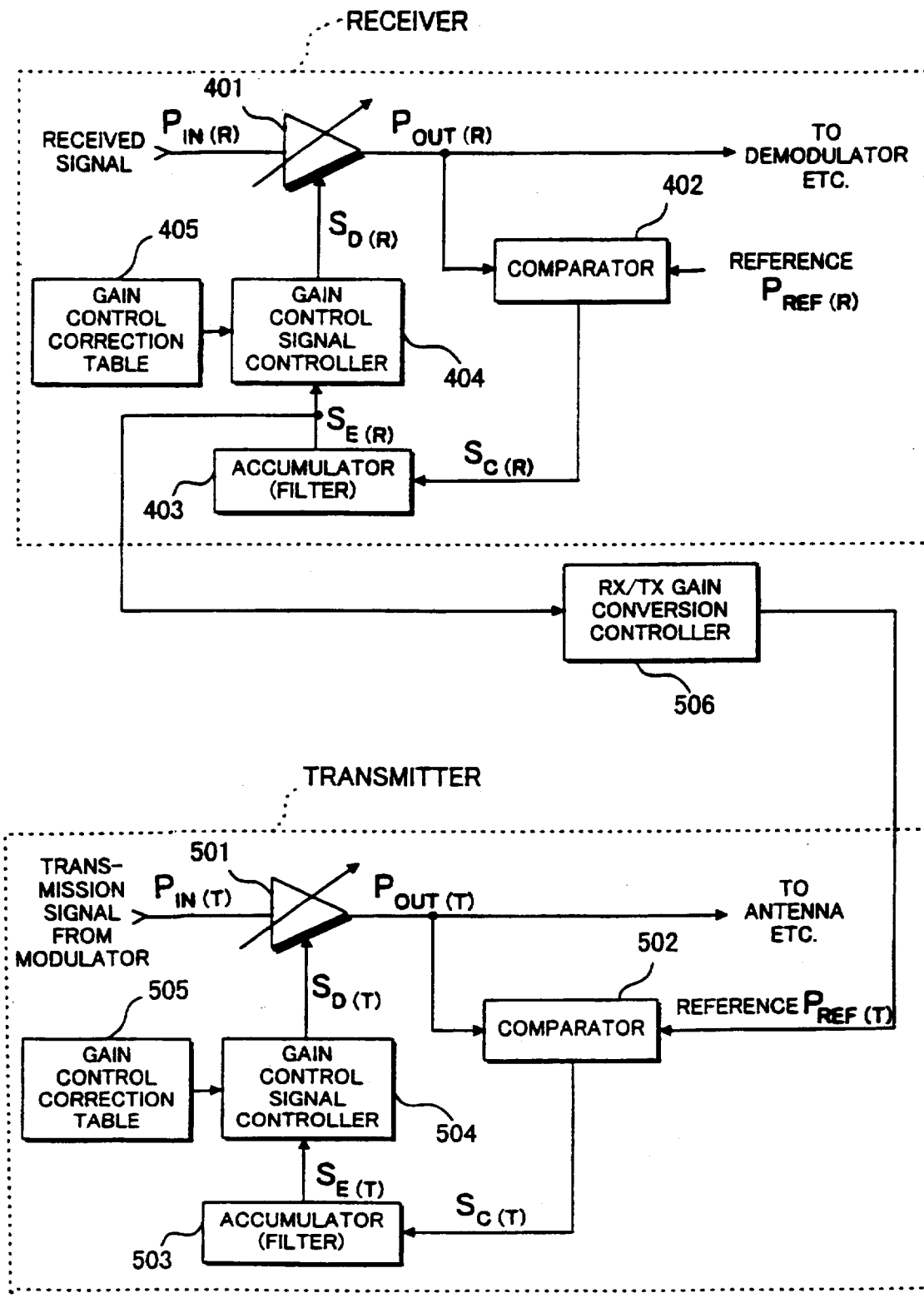
FIG. 6 is a block diagram showing receiver and transmitter employing the embodiment of the present invention in a DS-CDMA system.

Referring to FIG. 6, a receiver of the transceiver employs the digital or analog AGC circuit as shown in FIG. 1 or FIG. 5. The output level of the output signal $P_{OUT(R)}$ of the variable-gain amplifier 401 is compared with the reference output level $P_{REF(R)}$ by a comparator 402 which produces an error signal $S_{C(R)}$. The error signal $S_{C(R)}$ is accumulated by an accumulator 403 to produce an accumulated error signal $S_{E(R)}$. The accumulated error signal $S_{E(R)}$ is corrected by a gain control signal controller 404 using a gain control correction table 405 as described before. The gain control signal controller 404 corrects the accumulated error signal $S_{E(R)}$ to produce a gain control signal $S_{D(R)}$ so as to achieve the linear AGC characteristic of the variable-gain amplifier 401.

Similarly, a transmitter of the transceiver also employs the digital or analog AGC circuit as shown in FIG. 1 or FIG. 5. The output level of the output signal $P_{OUT(T)}$ of the variable-gain amplifier 501 is compared with a reference output level $P_{REF(T)}$ by a comparator 502 which produces an error signal $S_{C(T)}$. The error signal $S_{C(T)}$ is accumulated by an accumulator 503 to produce an accumulated error signal $S_{E(T)}$. The accumulated error signal $S_{E(T)}$ is corrected by a gain control signal controller 504 using a gain control correction table 505 as described before. The gain control signal controller 504 corrects the accumulated error signal $S_{E(T)}$ to produce a gain control signal $S_{D(T)}$ so as to achieve the linear AGC characteristic of the variable-gain amplifier 501.

In the transmitter, the comparator 502 receives the reference output level $P_{REF(T)}$ from a RX/TX gain converter controller 506. The accumulated error signal $S_{E(R)}$ generated by the accumulator 403 of the receiver is converted to the reference output level $P_{REF(T)}$ for the transmitter by the RX/TX gain converter controller 506. Therefore, the transmission power level is determined depending on the received signal level.

Since the transceiver employs an AGC circuit according to the present invention, the precise power control is achieved, resulting in improved quality of communication in the DS-CDMA system.

What is claimed is:

1. A gain control apparatus for controlling a gain of a variable-gain amplifier based on an error signal corresponding to a difference between an output level of the variable-gain amplifier and a reference level, the gain control apparatus comprising:

a memory storing discrete characteristic data sampled from a gain control characteristic of the variable-gain amplifier in sampling steps, each sampling step being set depending on a variation of the gain control characteristic; and a correction controller correcting the error signal based on continuous characteristic data generated from the discrete characteristic data stored in the memory, so that the gain control characteristics of the variable-gain amplifier is substantially linear with respect to the error signal.

2. The gain control apparatus according to claim 1, wherein each of the sampling steps is set to a smaller step as the variation of the gain control characteristic at a corresponding sampling position is larger and each of the sampling steps is set to a larger step as the variation of the gain control characteristic at a corresponding sampling position is smaller.

3. The gain control apparatus according to claim 1, wherein each sampling step is determined so that negligible errors are generated by linear interpolation in the sampling step.

4. The gain control apparatus according to claim 1, wherein each sampling step is set depending on a curvature of a gain control characteristic curve of the variable-gain amplifier.

5. The gain control apparatus according to claim 1, wherein the correction controller generates the continuous characteristic data from the discrete characteristic data by linear interpolation, generates a correction signal based on the continuous characteristic data and the error signal, and corrects the error signal using the correction signal.

6. A gain control method for controlling a gain of a variable-gain amplifier based on an error signal corresponding to a difference between an output level of the variable-gain amplifier and a reference level, the method comprising the steps of:

a) storing discrete characteristic data sampled from a gain control characteristic of the variable-gain amplifier in sampling steps, each sampling step being set depending on a variation of the gain control characteristic; and b) correcting the error signal based on continuous characteristic data generated from the discrete characteristic data, so that the gain control characteristic of the variable-gain amplifier is substantially linear with respect to the error signal.

7. The gain control method according to claim 6, wherein, in the step a), each of the sampling steps is set to a smaller step as the variation of the gain control characteristic at a corresponding sampling position is larger and each of the sampling steps is set to a larger step as the variation of the gain control characteristic at a corresponding sampling position is smaller.

8. The gain control method according to claim 6, wherein, in the step a), each sampling step is determined so that negligible errors are generated by linear interpolation in the sampling step.

9. The gain control method according to claim 6, wherein, in the step a), each sampling step is set depending on a curvature of a gain control characteristic curve of the variable-gain amplifier.

10. The gain control method according to claim 6, wherein the step b) comprises the steps of:

generating the continuous characteristic data from the discrete characteristic data by linear interpolation;

generating a correction signal based on the continuous characteristic data and the error signal; and correcting the error signal using the correction signal.

11. An automatic gain control circuit comprising:

a variable-gain amplifier varying in gain depending on a gain control signal;

a level comparator for comparing an output level of the variable-gain amplifier with a target level to produce an error signal corresponding to a difference between the output level of the variable-gain amplifier and a reference level;

a filter filtering the error signal to produce an original gain control signal;

a memory storing discrete characteristic data sampled from a gain control characteristic of the variable-gain amplifier in sampling steps, each sampling step being set depending on a variation of the gain control characteristic; and a correction controller correcting the original gain control signal based on continuous characteristic data generated from the discrete characteristic data to produce the gain control signal, so that the gain control characteristic of the variable-gain amplifier is substantially linear with respect to the original gain control signal.

12. The automatic gain control circuit according to claim 11, wherein each of the sampling steps is set to a smaller step as the variation of the gain control characteristic at a corresponding sampling position is larger and each of the sampling steps is set to a larger step as the variation of the gain control characteristic at a corresponding sampling position is smaller.

13. The automatic gain control circuit according to claim 11, wherein each sampling step is determined so that negligible errors are generated by linear interpolation in the sampling step.

14. The automatic gain control circuit according to claim 11, wherein each sampling step is set depending on a curvature of a gain control characteristic curve of the variable-gain amplifier.

15. The automatic gain control circuit according to claim 11, wherein the correction controller generates the continuous characteristic data from the discrete characteristic data by linear interpolation, generates a correction signal based on the continuous characteristic data and the original gain control signal, and corrects the original gain control signal using the correction signal to produce the gain control signal.

16. An automatic gain control circuit for use in a DS-CDMA (Direct Sequence-Code Division Multiple Access) communications system, the automatic gain control circuit controlling a gain of a variable-gain amplifier based on an error signal corresponding to a difference between an output level of the variable-gain amplifier and a reference level, the automatic gain control circuit comprising:

a memory storing discrete characteristic data sampled from a gain control characteristic of the variable-gain amplifier in sampling steps, each sampling step being set depending on a variation of the gain control characteristic; and a correction controller correcting the error signal based on continuous characteristic data generated from the discrete characteristic data stored in the memory, so that the gain control characteristic of the variable-gain amplifier is substantially linear with respect to the error signal.

17. An automatic gain control method for use in a DS-CDMA (Direct Sequence-Code Division Multiple Access) communications system, the automatic gain control method controlling a gain of a variable-gain amplifier based on an error signal corresponding to a difference between an output level of the variable-gain amplifier and a reference level, the automatic gain control method comprising the steps of:

storing discrete characteristic data sampled from a gain control characteristic of the variable-gain amplifier in sampling steps, each sampling step being set depending on a variation of the gain control characteristic; and correcting the error signal based on continuous characteristic data generated from the discrete characteristic data, so that the gain control characteristic of the variable-gain amplifier is substantially linear with respect to the error signal.

* * * * *